United States Patent [19]
Takahashi et al.

[11] Patent Number: 5,729,315
[45] Date of Patent: Mar. 17, 1998

[54] CIRCUIT ASSEMBLY AND PROCESS FOR PRODUCTION THEREOF

[75] Inventors: Masanori Takahashi, Chigasaki; Tetsuro Saito, Isehara; Hideo Mori; Toshimichi Ouchi, both of Yokohama; Kenji Niibori, Chigasaki, all of Japan

[73] Assignee: Canon Kabushiki Kaisha, Tokyo, Japan

[21] Appl. No.: 563,827

[22] Filed: Nov. 28, 1995

[30] Foreign Application Priority Data

Nov. 28, 1994 [JP] Japan .................. 6-293508

[51] Int. Cl.$^6$ .......... G02F 1/136; G02F 1/1345; G02F 1/13
[52] U.S. Cl. .......... 349/149; 349/42; 349/201; 349/152
[58] Field of Search .......... 359/88, 59, 95, 359/42, 149, 207, 152

[56] References Cited

U.S. PATENT DOCUMENTS

| | | | |
|---|---|---|---|
| 4,283,118 | 8/1981 | Inoue | 359/88 |
| 4,643,526 | 2/1987 | Watanabe et al. | 359/88 |
| 4,721,365 | 1/1988 | Nishimura | 359/88 |
| 4,832,455 | 5/1989 | Takeno et al. | 359/88 |
| 5,122,215 | 6/1992 | Shibata et al. | 359/88 |
| 5,223,965 | 6/1993 | Ota et al. | 359/98 |
| 5,386,309 | 1/1995 | Nam | 359/88 |
| 5,412,494 | 5/1995 | Ishiwata et al. | 359/68 |

FOREIGN PATENT DOCUMENTS

| | | | |
|---|---|---|---|
| 0475402 | 3/1992 | European Pat. Off. | |
| 60-177323 | 9/1985 | Japan . | |
| 4-188800 | 7/1992 | Japan . | |
| 6-043471 | 2/1994 | Japan . | |
| 2118365 | 10/1983 | United Kingdom | 359/95 |

Primary Examiner—William L. Sikes
Assistant Examiner—Julie Ngo
Attorney, Agent, or Firm—Fitzpatrick, Cella, Harper & Scinto

[57] ABSTRACT

A circuit assembly suitable for constituting, e.g., a liquid crystal display device, is constituted by a transparent first substrate having thereon a plurality of first electrodes, and a second substrate having thereon a plurality of second electrodes and at least partially superposed with the first substrate so that the mutually corresponding first and second electrodes are superposed and electrically connected with each other. The first electrode has a light-transmissive layer and an opaque layer laminated with the light transmissive layer, and a portion of the first electrode superposed with the second substrate at least partially includes a light-transmissive portion. The first or second substrate has an alignment mark at a position thereof corresponding to the light-transmissive portion of the first electrode. The first substrate may for example be combined with another first substrate so as to sandwich a liquid crystal therebetween to form a liquid crystal device. The second substrate may carry a semiconductor IC chip for supplying drive signals to the liquid crystal device.

45 Claims, 12 Drawing Sheets

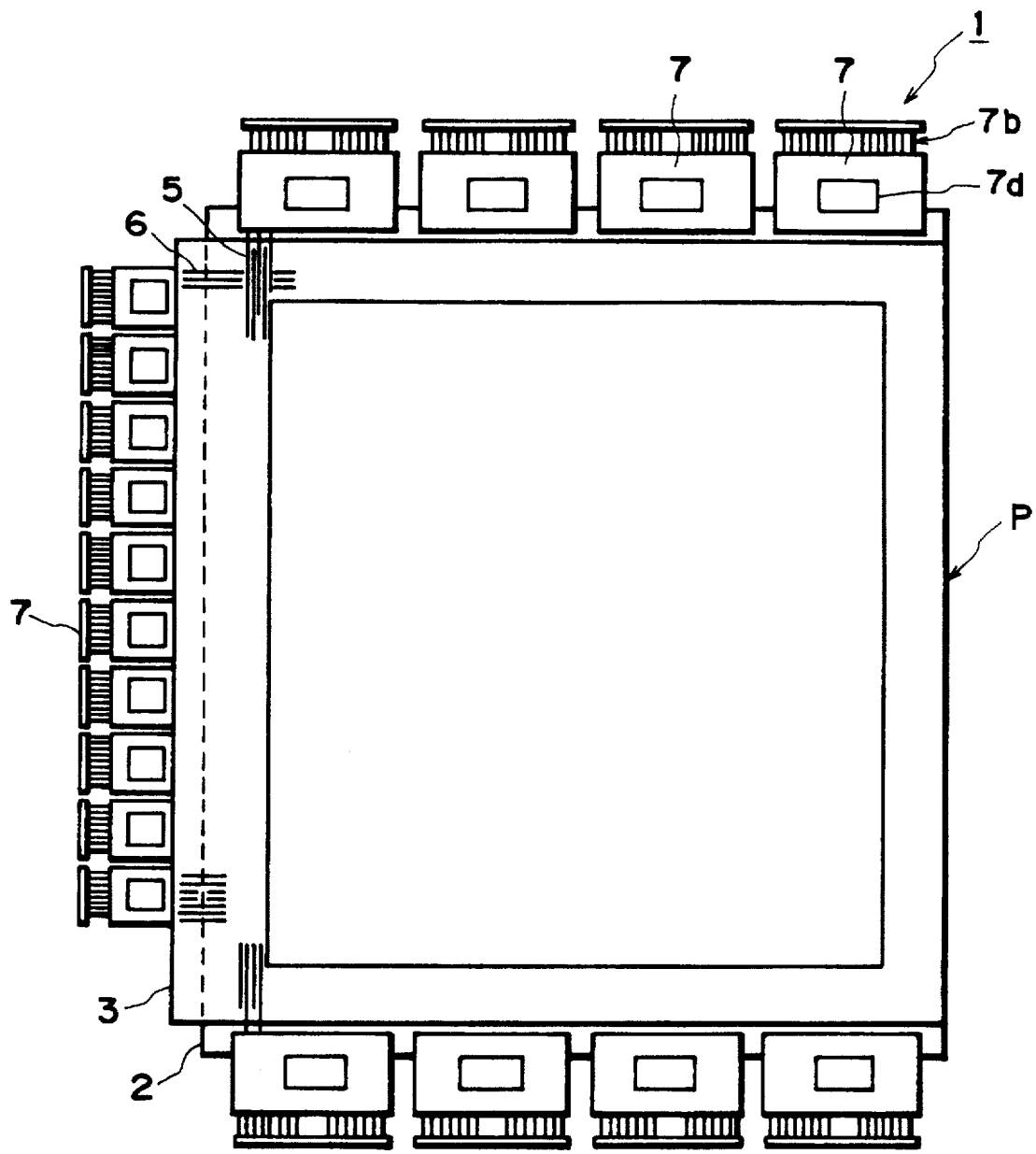
FIG. I
PRIOR ART

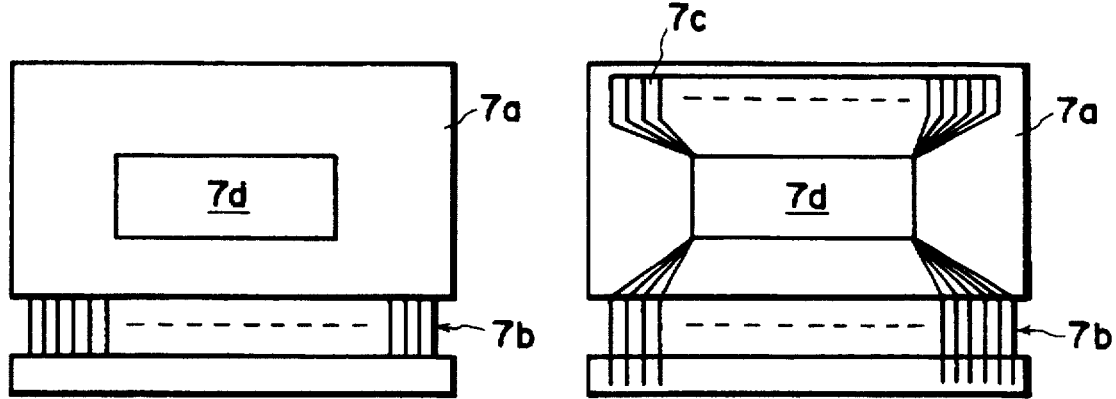
F I G. 2A
PRIOR ART
F I G. 2B
PRIOR ART
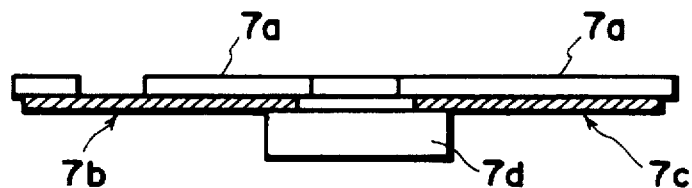
F I G. 2C
PRIOR ART
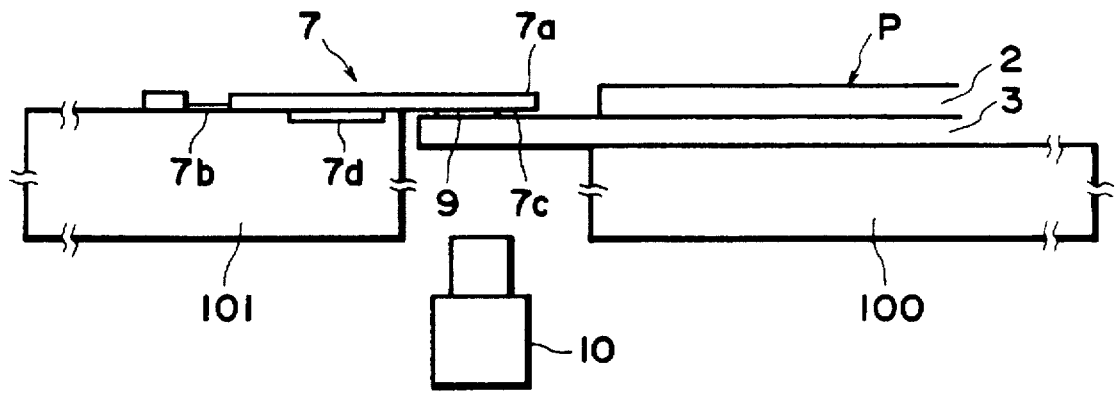
F I G. 3

CIRCUIT ASSEMBLY AND PROCESS FOR PRODUCTION THEREOF

FIELD OF THE INVENTION AND RELATED ART

The present invention relates to a circuit assembly for use in display apparatus, image sensors, recording heads, light-emitting device arrays, etc., and a process for production thereof.

A circuit assembly is frequency used in many electrical apparatus or devices of almost all aspects, typical application examples of which may include display devices inclusive of a liquid crystal device, a plasma device, DMD, and a electrochromic device; image sensors, inclusive of a thin-film type sensor comprising amorphous silicon, and a multi-tip-type sensor provided with an arranged plurality of IC chips; recording heads, inclusive of a thermal head and an ink jet head; and light-emitting device arrays, inclusive of an LED array, and an electron discharge device array.

For easy understanding of a circuit assembly, the application thereof for a liquid crystal device, for example, will described.

FIG. 1 shows a liquid crystal display apparatus (as an example of circuit assembly) including a combination of a liquid crystal panel (first circuit substrate) P and TAB films for liquid crystal drive (second circuit substrates) 7 connected to the liquid crystal panel P.

More specifically, the liquid crystal display apparatus 1 includes a liquid crystal panel P, which comprises a glass substrate 2 on which data electrodes are disposed, and a glass substrate 3 on which scanning electrodes are disposed. The glass substrates 2 and 3 do not have the same shape, but the glass substrate 2 protrudes out of the other glass substrate 3 at both upper and lower edges, and the glass substrate 3 protrudes out of the glass substrate 2 at the left edge. One glass substrate 2 is provided with a large number of stripe-shaped data electrodes 5 disposed on one surface thereof, and the other glass substrate 3 is provided with a large number of similarly stripe-shaped scanning electrodes 6. These electrodes 5 and 6, in combination, form a matrix electrode structure (only a portion thereof being shown) suitable for multiplexing drive. These electrodes 5 and 6 are extended up to the edges of the substrates 2 and 3, so that the data electrodes 5 are exposed outside at the upper and lower peripheries of the glass substrate 2, and the scanning electrodes 6 are exposed outside at the left periphery of the glass substrate 3. The glass substrates 2 and 3 are disposed opposite to each other so as to sandwich a liquid crystal therebetween with their electrode-provided surfaces.

To the liquid crystal panel P of such a structure are connected the TAB films for liquid crystal drive (second circuit substrate) 7. FIGS. 2A–2C are a top plan view, a bottom plan view and a thicknesswise sectional view, respectively, of such a TAB film 7.

Referring to FIGS. 2A–2C, the liquid crystal-drive TAB film 7 comprises a soft base film 7a of, e.g., polyimide resin, etc., on which input terminals 7b and output terminals 7c are formed of, e.g., patterned copper foil electrodes, and a liquid crystal-drive IC chip (drive semiconductor) 7d is mounted by TAB between and connected with the terminals 7b and 7c. Signals inputted to the input terminals 7bof the TAB film 7 are converted into signals of prescribed waveforms by a liquid crystal-drive IC chip 7d and then to the electrodes 5 and 6 of the liquid crystal panel P to drive the liquid crystal panel P for displaying various data. The base film 7a may be formed by stamping a film carrier tape as a flexible circuit substrate. The input terminals 7b and 7c may be formed by etching of a copper foil or film formed on the base film 7a into a prescribed pattern and further plating with Au or Sn. As shown in FIG. 2C, a portion of the base film 7a may be removed to provide the input terminal 7b with a partially overhanging structure or separation from the base film 7a and generally further coverage with an elastomer or resin so that an external stress applied to the base film is prevented from being directly applied to the input terminal 7b. A similar overhang structure or separation from the base film 7b may also be given to the output terminal 7c.

The above-mentioned liquid crystal-drive TAB film 7 and the liquid crystal panel P may be connected to each other in the following manner. The TAB film 7 and the panel P are respectively provided with an alignment mark for positional alignment therebetween. FIG. 3 is a schematic side illustration for illustrating a manner of the positional alignment. For the connection, an anisotropic electroconductive adhesive (member) 9 is used.

The alignment apparatus includes a liquid crystal panel alignment unit 100 for carrying the liquid crystal panel P, and the unit 100 is arranged so as to be movable freely in three-dimensional directions. The apparatus further includes a TAB alignment unit 101 for carrying the liquid crystal drive TAB film 7, and the unit is also arranged so as to be freely movable three-dimensionally. The apparatus also includes a camera 10 for monitoring the positions of the liquid crystal panel P and the TAB film 7, so that the alignment mark on the liquid crystal panel P (hereinafter called "substrate-side mark" or "panel-side mark") is observed under vertical falling illumination and the alignment mark on the TAB film 7 (hereinafter called "TAB-side mark") is observed under illumination with side illumination light. Herein, the vertical falling illumination is a manner of illuminating an object through an objective lens while disposing a semitransparent mirror between the objective lens and an image forming position, and the illumination with side-illumination light is dark-field illumination of illuminating an object with illumination light obliquely incident to the object, both being well known in the field of an optical microscope (see, e.g., "Kogaku Gijutsu Handbook" (Optical Technology Handbook), page 852 (published from Asakura Shoten K.K.).

As shown in FIG. 3, the camera 10 is disposed on a backside of the liquid crystal panel P (opposite side of the liquid crystal-drive TAB film 7), so that the substrate-side mark is observed through the glass substrate 3 and the TAB-side mark is observed through the glass substrate 3 and transparent films (transparent conductor films and the anisotropic conductive adhesive, etc.) formed on the substrate.

Now, the operation for the positional alignment is described.

The liquid crystal panel P is loaded on the liquid crystal panel alignment unit 100, and the liquid crystal-drive TAB film 7 is loaded on the TAB alignment unit 101. Then, the TAB-side mark and the substrate-side mark are recognized by the camera 10 to calculate an amount of positional deviation between both marks. Based on the amount of the positional deviation, both or either one of the alignment units may be moved to effect a positional adjustment between the liquid crystal panel P and the TAB film 7, whereby the electrodes 5 and 6 of the liquid crystal panel P are positionally aligned with the output terminals 7c on the TAB film 7.

The above-mentioned data electrodes 5 and the scanning electrodes 6 may be composed of transparent electrodes of ITO, etc., or metal electrodes.

In the case where the electrodes 5 and 6 are composed of transparent electrodes, the substrate-side mark may also be formed of the same transparent electrode material. As a result, in the case of observation by the vertical falling illumination, the contrast between substrate-side mark and the glass substrates 2 and 3 becomes small while it depends on the thickness of the transparent electrodes, so that the image recognition by the camera 10 is found to be very difficult.

On the other hand, in the case where the electrodes 5 and 6 are composed of metal electrodes, it has been found impossible to effect the positional alignment because the recognition of the TAB side mark is obstructed by the opaque metal electrodes. FIGS. 4A and 4B are schematic views showing images observed in the finder of the camera 10. In case where a TAB-side mark 11 (to be aligned with a substrate-side mark 12)is not aligned with an electrode 6 as shown in FIG. 4A, the mark can be recognized. However, in case where the mark 11 is hidden by an electrode 6 as shown in FIG. 4B, the image processing with the camera is hindered so that the positional alignment becomes impossible.

SUMMARY OF THE INVENTION

A principal object of the present invention is to provide a circuit assembly having solved the above-mentioned problems and allowing an accurate positional alignment.

Another object of the present invention is to provide a circuit assembly allowing an accurate positional alignment even in case of using an alignment mark of a simple structure.

A further object of the present invention is to provide a process for producing such a circuit assembly.

According to a principal aspect of the present invention, there is provided a circuit assembly, comprising:

- a transparent first substrate having thereon a plurality of first electrodes, and
- a second substrate having thereon a plurality of second electrodes and at least partially superposed with the first substrate so that the mutually corresponding first and second electrodes are superposed and electrically connected with each other,
- wherein the first electrode has a light-transmissive layer and an opaque layer laminated with the light transmissive layer, and a portion of the first electrode superposed with the second substrate at least partially includes a light-transmissive portion, and
- the first or second substrate has an alignment mark at a position thereof corresponding to the light-transmissive portion of the first electrode.

According to another aspect of the present invention, there is provided a process for producing a circuit assembly, comprising the steps of:

- providing a light-transmissive first substrate having thereon a group of first electrodes including a first electrode having a light-transmissive portion and first electrodes having an opaque portion,
- providing a second substrate having thereon a group of second electrodes and an alignment mark,
- superposing the first and second substrates with an adhesive disposed therebetween,
- positionally aligning the first and second substrates by means of said alignment mark; and
- bonding the first and second substrates to each other.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIG. 1 is a schematic plan view of a display apparatus including a circuit assembly.

FIGS. 2A –2C are a top plan view, a reversed plan view and a side sectional view of a TAB film used in a circuit assembly.

FIG. 3 is a schematic side view of a positional alignment apparatus for a circuit assembly.

DESCRIPTION OF THE PREFERRED EMBODIMENTS

Figure 4A:
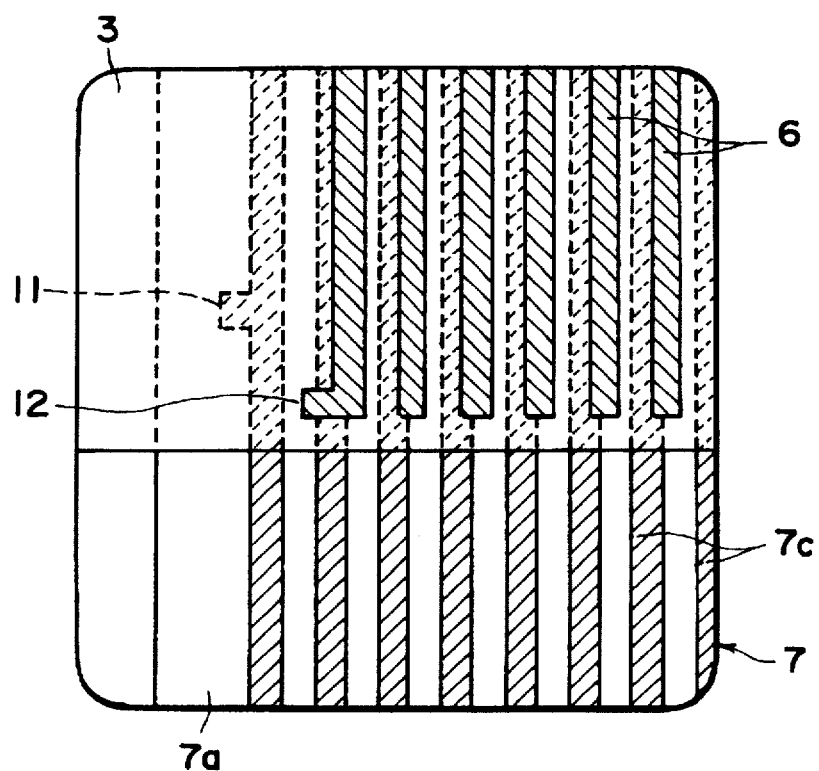
FIGS. 4A an 4B are views observed through a camera for positional alignment of a circuit assembly.
Figure 4B:
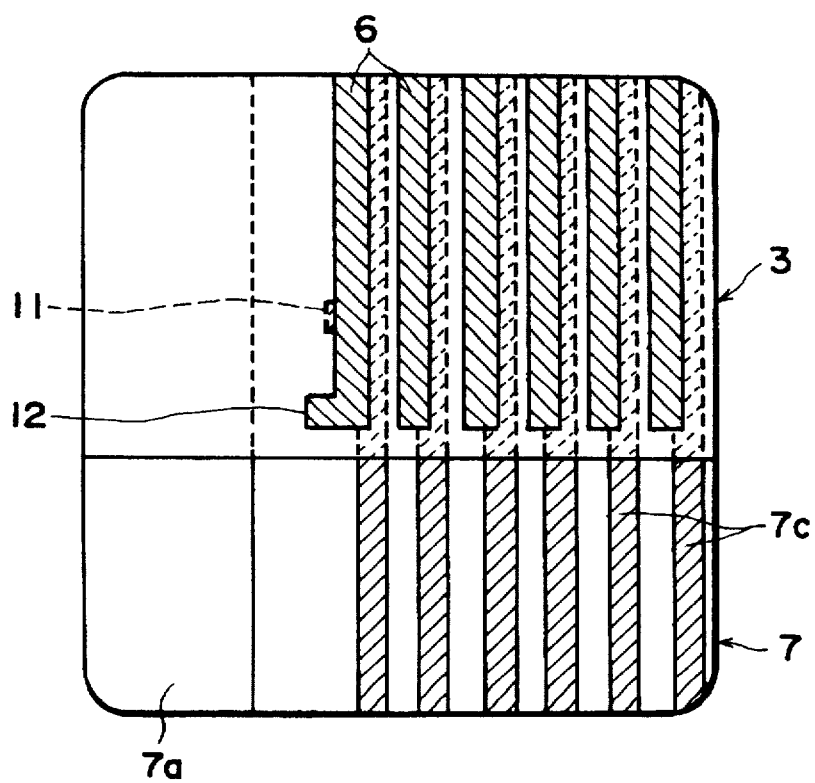
Figure 5:
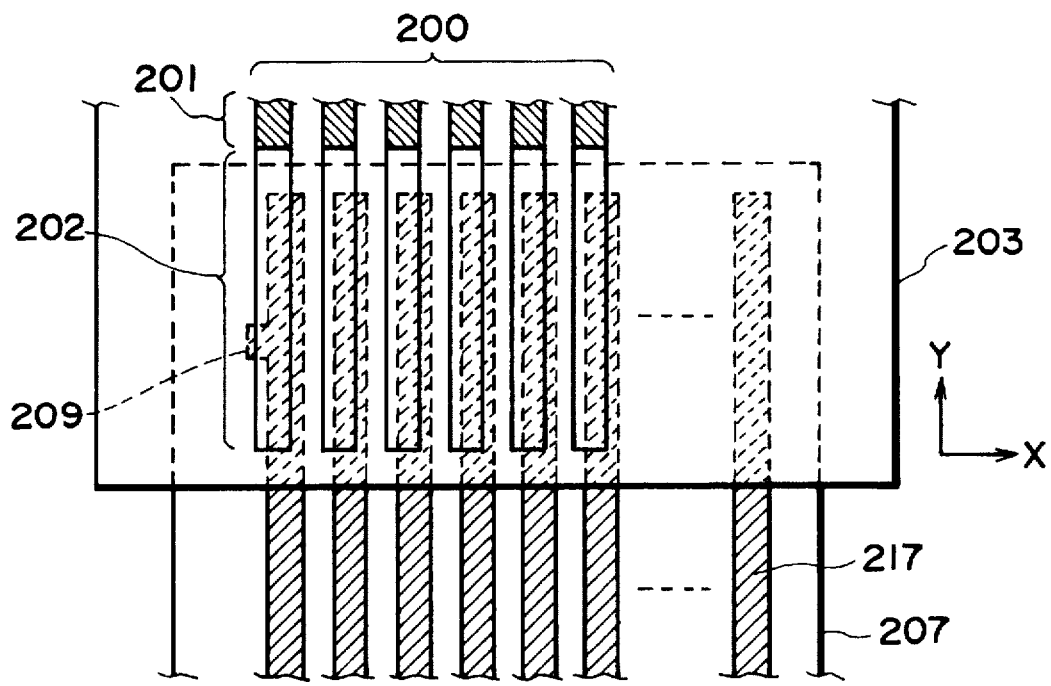
FIG. 5 is a schematic partial plan view of an embodiment of the carrier assembly according to the invention.

FIG. 5 is a schematic partial plan view of an embodiment of the circuit assembly according to the present invention.

The circuit assembly includes a light-transmissive first substrate 203 on which first electrodes 200 are disposed. Each first electrode 200 has an opaque portion 201 and a transparent portion 202.

The circuit assembly also includes a second substrate 207, on which second electrodes 217 and an alignment mark 209 are disposed.

FIG. 5 shows a transient state during a positional alignment step, so that a major portion of the mark 209 overlaps one of the first electrodes 200 but, if the first substrate 203 is moved in a direction X or the second substrate 207 is moved in a direction opposite to the direction X, such a positional relationship can be established that the corresponding first and second electrodes are respectively superposed with each other and the mark 209 is free from overlapping with any of the first electrodes. This is a suitable position for electrode connection.

In this embodiment, a portion of each first electrode 200 corresponding to the alignment mark 209 is light-transmissive, so that the mark 209 can be recognized through the light-transmissive portion even if the mark 209 and the first electrodes are superposed so that missing of the mark 209 during the alignment step can be avoided.

The alignment mark 209 may be disposed in contact with the first electrode (i.e.,.., one of the first electrodes) 200 as shown in FIG. 5 or in separation from the first electrode. However, in the case of disposing a plurality (first or second) substrates for connection with the other type of substrate as shown in FIG. 1, the mark 209 may preferably be disposed in contact with or in close proximity with the first electrode.

It is also possible to dispose the mark 209 on the first substrate 203, and the second electrodes 217 per se may be used also as an alignment mark for the second substrate 207.

It is further preferred to provide both the first and second substrates with respective alignment marks exclusively used for that purpose as shown in a later-described embodiment. In that case, the two exclusive alignment marks are disposed so as not to overlap each other in a position aligned as suitable for electrical connection.

All the first electrodes 200 need not be provided with a light-transmissive position but at least one first electrode preferably disposed at an extreme side may be provided with such a light-transmissive portion.

The mark which can be disposed on the first substrate 203 may preferably be opaque and may preferably be disposed at a position discrete from the opaque portions 201 of the first electrodes 200.

Figure 6:
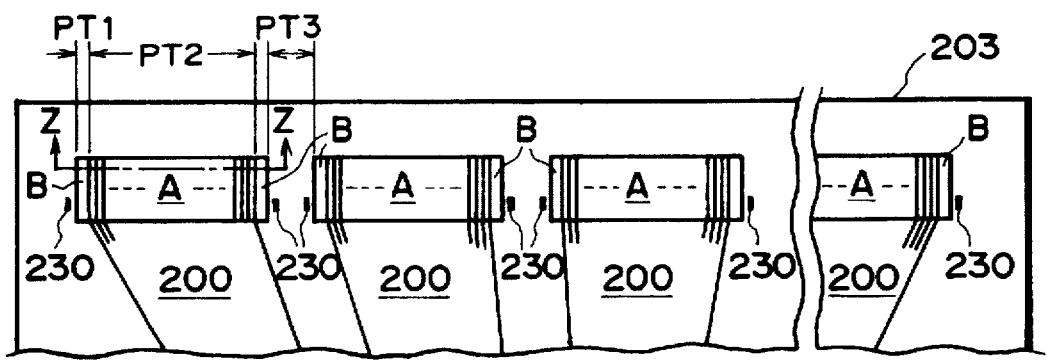
FIG. 6 is a schematic plan view of an example of substrate used in a circuit assembly according to the invention.

FIG. 6 is a partial schematic plan view of an example of such a light-transmissive first substrate.

FIG. 6 shows 4 arrays each composed of a number (n) of electrodes including a number (b) of light-transmissive electrodes on both sides B and a number (a) of opaque electrodes in a central region A. Thus, each array includes a number (n=b+a) of electrodes.

The number a is at least 1, preferably 2 or more, further preferably 4 or more, but the light-transmissive electrode in a region B need not necessarily be provided in a separate plurality if it is provided with a required area corresponding to such a plurality of electrodes.

Among the electrodes, at least the electrodes in the region A are connected to functional elements, such as display pixels, photoelectric conversion elements and light-emitting elements. The electrodes in the region(s) B may also be connected to such functional elements but can be dummy electrodes not connected to such functional elements.

Each region B may be provided in a width (i.e., length in a direction of disposition) PT1 which may be at most ⅒, preferably at most 1/20, further preferably at most 1/50, of a width PT2 of the region A.

The adjacent arrays may be disposed with a spacing PT3 larger than PT1 so that one alignment mark 230 each is provided in two regions each having a width of a half of PT3 so as to allow a high-density disposition.

Each electrode may have a width of 5–800μm, preferably 20–250μm and may be disposed with a spacing of 5–800μm, preferably 20–250μm, from each adjacent electrode.

The above-mentioned electrode size, spacing and number of disposition thereof may suitably be applied to a circuit assembly as shown in FIG. 1 or 6 wherein one substrate (2, 3 or 203) is connected with a plurality of other substrates (7) so as to allow easy assemblage.

Figure 7:
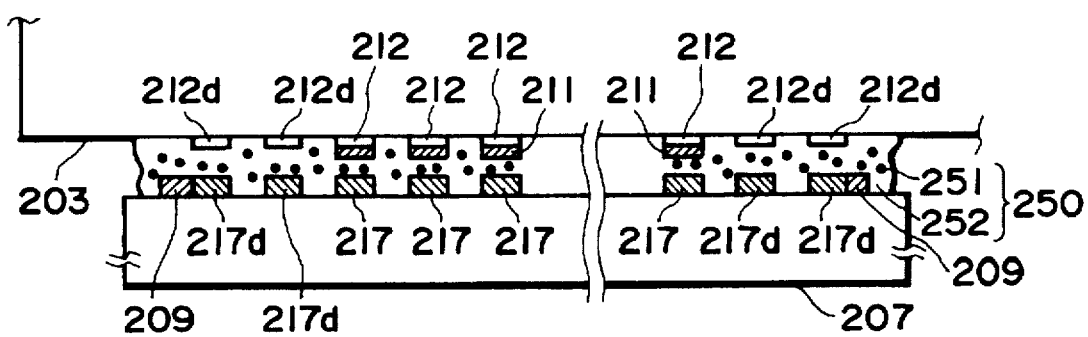
FIG. 7 is a schematic sectional view of an embodiment of the circuit assembly according to the invention.

FIG. 7 is a partial schematic sectional view of a circuit assembly according to an embodiment of the present invention which is in a state after positional alignment and before bonding (electrical connection). The structure may be understood as a sectional view taken along a dot-and-dash line Z—Z in FIG. 6 when the substrate shown in FIG. 6 is superposed with a substrate as shown in FIGS. 2A–2C.

The circuit assembly includes light-transmissive electrodes 212d in the region B, and functionally opaque electrodes including a non-light-transmissive conductor layer 211 and a light-transmissive conductor layer 212.

Opaque electrodes 217 are disposed on an opposite second substrate 207, on which are further disposed opaque electrodes 217d and alignment marks 209 in a region corresponding to the region B.

Between the substrates 203 and 207 is disposed an anisotropic electroconductive adhesive 250 which comprises electroconductive fine particles 251 and an adhesive resin 252 which may be a curable-type resin, i.e., a thermosetting resin, photosetting resin or thermo-photosetting resin, or a non-curable type resin. When the two substrates are pressed against each other for bonding, the electrodes on both substrates are electrically connected to each other via the fine particles 251.

In case where the electrodes in the region B are dummy electrodes, even when a force for separating both substrate occurs due, e.g., to a thermal strain or a compression force, the force may be absorbed by the electrodes to stabilize the connection between the electrodes (211, 212) and the electrodes (217).

The first substrate used in the present invention may be a light-transmissive substrate which is light-transmissive at least in a region required for positional alignment.

More specifically, the first substrate may comprise a substrate, generally a sheet, of a light-transmissive material such as glass, quartz, alumina or resin.

The second substrate used in the present invention may be either light-transmissive or non-light-transmissive and either rigid or flexible.

The rigid substrate may comprise a material similar to that of the first substrate, or ceramic or metal. The flexible substrate material may include polyimide, polyester and epoxy glass.

The first electrode may preferably comprise a laminated structure including a light-transmissive layer and a non-light-transmissive layer which may be disposed in this order or in an opposite order.

The light-transmissive layer may for example comprise tin oxide, indium oxide, or indium tin oxide (ITO). The non-transmissive layer may comprise a metal, such as aluminum, chromium, molybdenum, tungsten, titanium, copper, gold, silver, or platinum; or an alloy of these metals alone or with other metals optionally containing an appropriate amount of non-metallic elements, such as silicon, nitrogen and oxygen.

The term "light-transmissive" or "transparent" used herein refers to a property of allowing a required level of transmission of light used for positional alignment, and the term "non-light-transmissive" or "opaque" refers to a property of interrupting the transmission of light used for positional alignment in a level for providing an appropriate level of contrast.

A particularly preferred example of combination of light-transmissive and non-light-transmissive material may include a combination of a transparent metal oxide and a metal so as to provide a sufficient contrast between the light-transmissive electrodes and non-light-transmissive electrodes or alignment marks.

Figure 8:
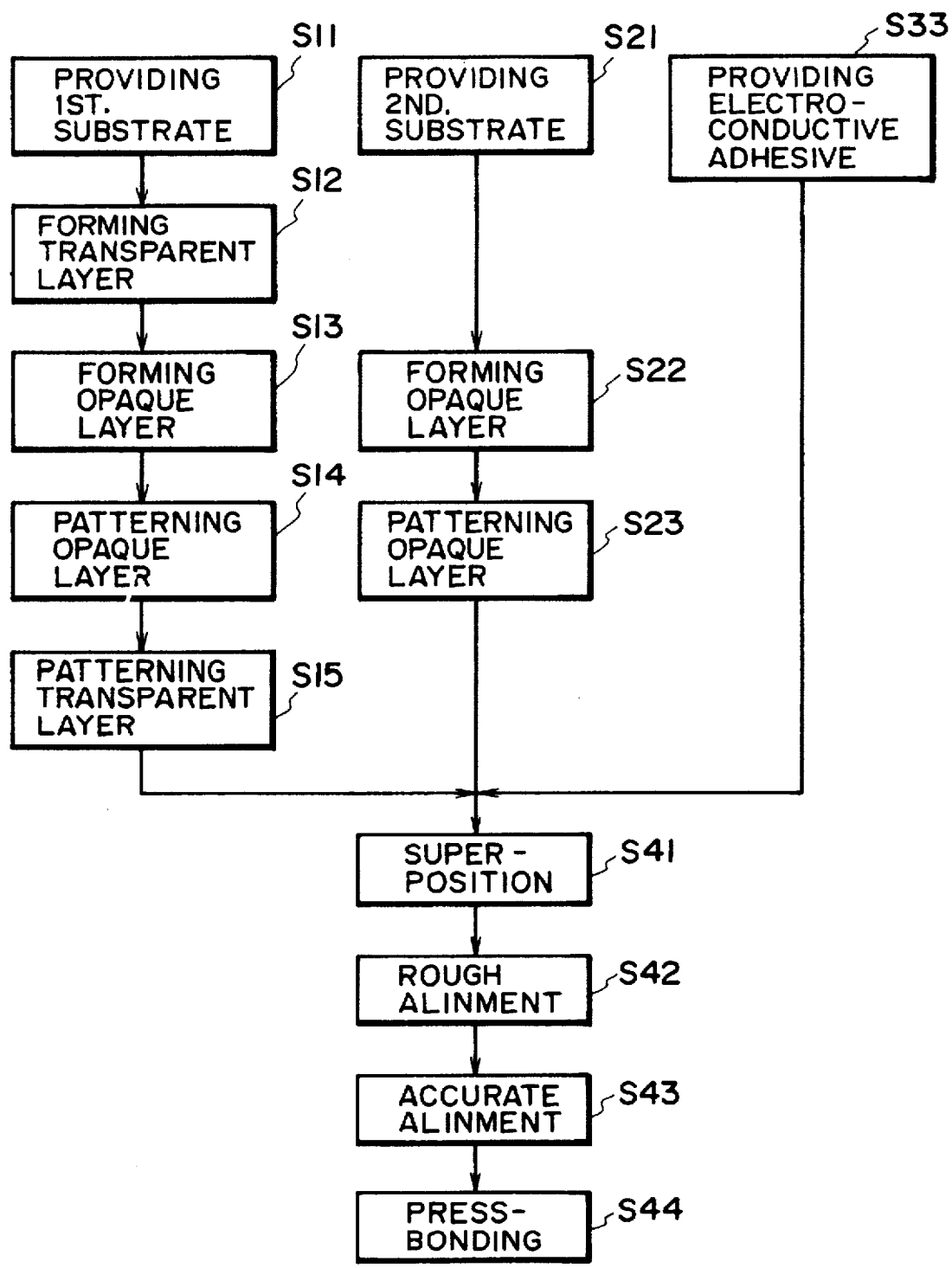
FIG. 8 is a flow chart for describing an embodiment of the process for producing a circuit assembly according to the invention.

FIG. 8 is a flow chart representing an embodiment of the process for producing a circuit assembly according to the present invention.

According to the process, a first substrate is provided (S11), a light-transmissive conductor film is formed thereon (S12), and a non-light-transmissive conductor layer is formed thereon (S13). Then the light-transmissive and non-light-transmissive conductor films are selectively etched to provide an electrode pattern (S14, S15).

On the other hand, a second substrate is provided (S21), and a non-light-transmissive conductor film is formed (S22) and patterned (S23) thereon.

In the steps S14 and S23, alignment marks are simultaneously formed.

Separately, an anisotropic electroconductive adhesive is provided (S33), and the first and second substrates are superposed with each other with the adhesive on at least one thereof (S41) and subjected to a rough positional alignment therebetween by observation with eyes (S42).

Thereafter, an accurate auto-alignment is performed by using a camera with the aid of the alignment marks (S43).

After the completion of the positional alignment, the electrodes on both substrates are press-bonded to each other while avoiding a positional deviation. At this time, the adhesive may be cured so as to ensure the reliability of the bonding.

The respective steps may be replaced by an appropriate alternative step or some additional steps may be inserted. Details thereof will be understood by referring to specific embodiments described hereinafter.

The camera used for the auto-alignment may preferably be of a type allowing the vertical falling illumination and the dark field illumination and may preferably be provided with a data process circuit for calculating a positional deviation of alignment marks and a drive unit for driving alignment units carrying the first and second substrates.

First embodiment

Hereinbelow, a first specific embodiment of the present invention will be described with reference to FIGS. 9-13, wherein members identical to those shown in FIGS. 1-3 are denoted by identical reference numerals and description thereof will be omitted.

Figure 9:
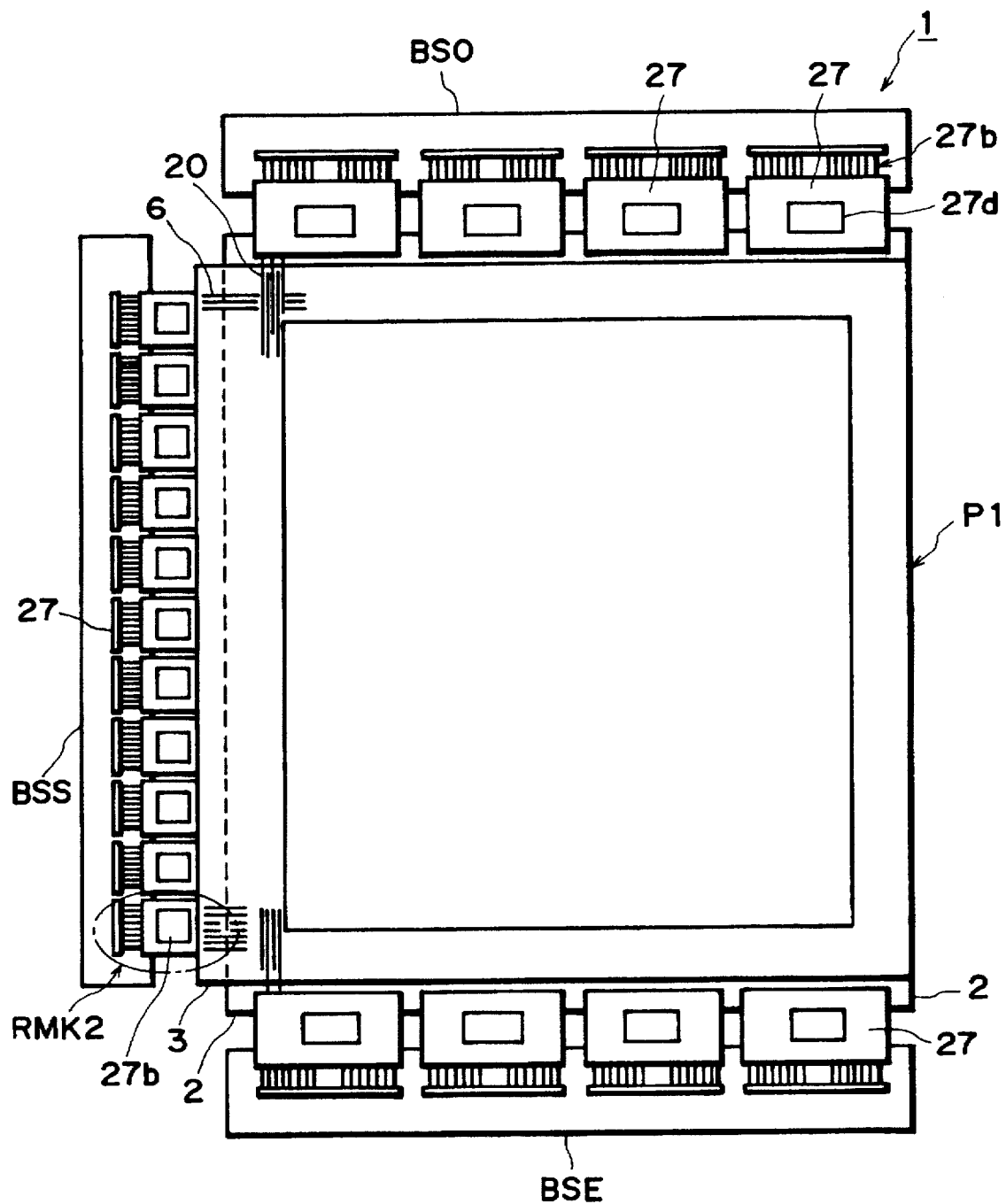
FIG. 9 is a schematic plan view of a liquid crystal display apparatus including a first embodiment of the circuit assembly according to the invention.

FIG. 9 is a schematic plan view of a liquid crystal display apparatus including a circuit assembly according to this embodiment.

Figure 10:
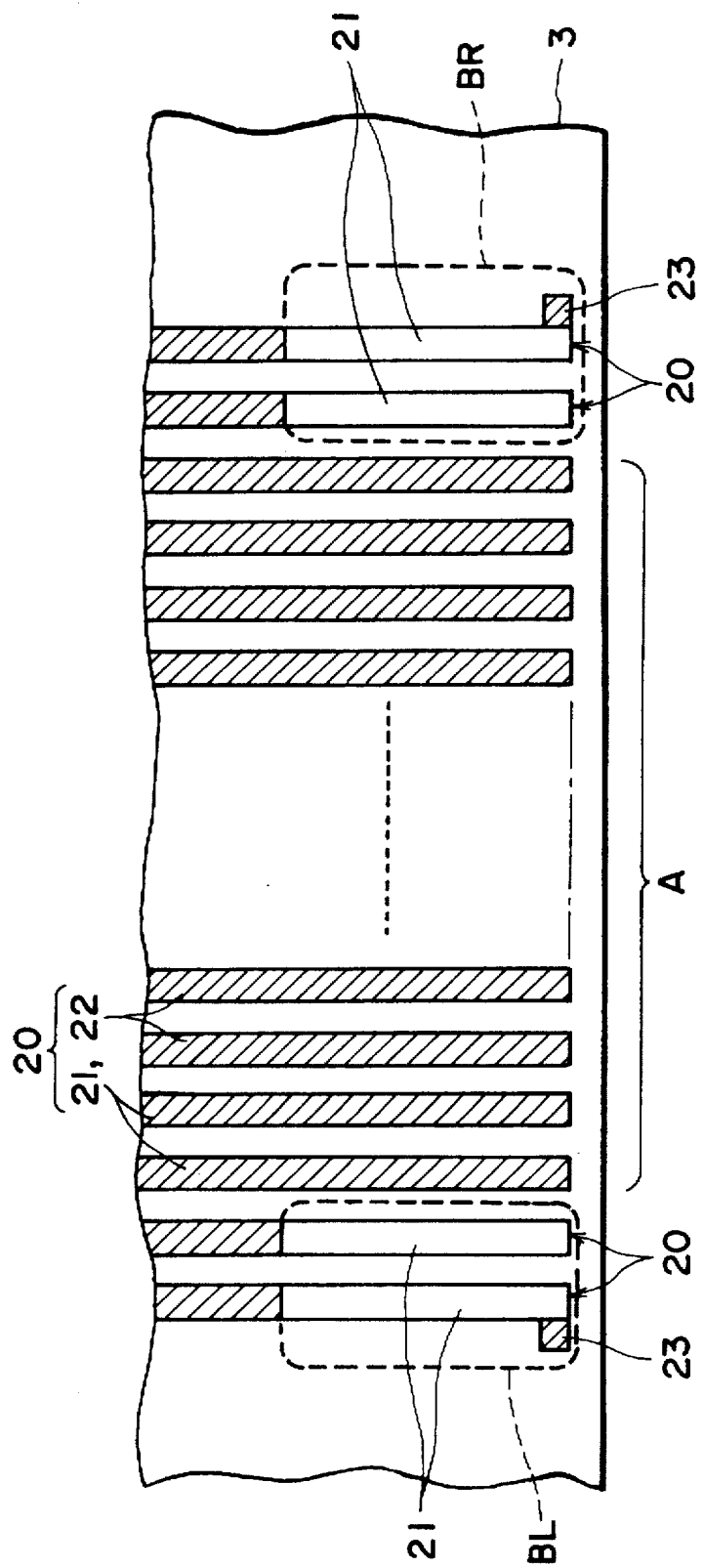
FIG. 10 is a schematic plan view of a first substrate used in the first embodiment of the circuit assembly.

FIG. 10 is an enlarged partial view of a part (RMK2) of the liquid crystal display apparatus of FIG. 9, showing an electrode pattern on a glass substrate 3 constituting the part (RMK2).

Figure 11:
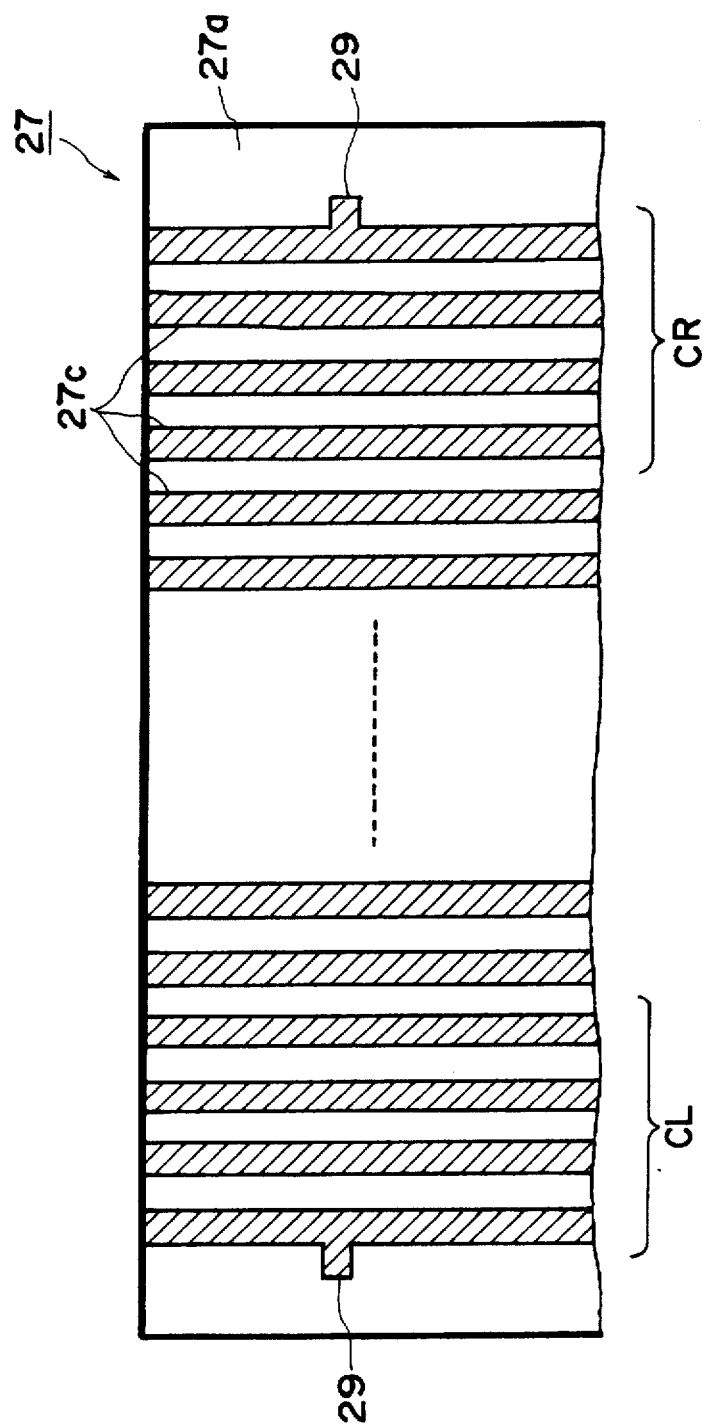
FIG. 11 is a schematic plan view of a second substrate used in the first embodiment of the circuit assembly.

FIG. 11 is an enlarged partial view of a part (RMK2) of the apparatus of FIG. 9, showing an electrode pattern on a TAB film 27.

The liquid crystal display apparatus according to this embodiment includes a liquid crystal panel P1, TAB films 27 carrying a drive IC chip, and bus substrates BSS, BSO and BSE. Four TAB films 27 are connected to the bus substrate BSO so that the IC chips 27d thereon are supplied with display data for odd-numbered data electrodes and drive signals for the IC chips 27d per se via the bus substrate BSO.

Similarly, the bus substrate BSE has a function of transferring display data for even-numbered data electrodes and drive signals for IC chips 27d connected thereto.

The bus substrate BSS is connected with 11 TAB films 27 and has a function of transferring signals, such as clock pulses, address data and reference voltages so as to have the IC chips 27d on the TAB films 27 generate signals supplied to the scanning electrodes.

Now, further explanation will be made with reference to one TAB film 27 in a region denoted by RMK2 for example.

The glass substrate 3 of the liquid crystal panel P1 is provided with a large number of scanning electrodes 20 each in the form of a stripe as shown in FIG. 10. The scanning electrodes 20 in the central region A of the glass substrate 3 have a laminated structure of a transparent electrode 21 and a metal electrode 22, and a large number thereof extends up to the edge or periphery (exposed part) of the glass substrate 3. On the other hand, the scanning electrodes 20 on both outsides of the region A have such a laminated structure including a metal electrode up to their intermediate point and have a single layer structure of a transparent electrode 21 in peripheral side regions BR and BL. (The electrodes of the laminated structure are shown with a hatching in the figure.) The metal electrodes 22 have a function of lowering the electric resistance of the electrodes 20 to provide an increased drive speed of the liquid crystal panel. In this embodiment, the transparent electrodes 21 have the same width as the metal electrode 20 and their full width is coated by the metal electrodes 22. The liquid crystal panel P1 in this embodiment is designed to be driven by the electrodes 20 in the region A, and the electrodes 20 in the side regions BR and BL do not participate in the drive, thus constituting so-called dummy electrodes.

The two side regions BR and BL are respectively provided with a panel-side mark (first alignment mark) 23. The panel-side marks 23 are formed outside of and in the proximity of the outermost electrodes 20 and respectively formed in an almost square pattern. FIG. 10 shows only a structure regarding one glass-substrate 3, but actually the other glass substrate 2 are also provided with data electrodes and panel-side marks of similar shapes so as to form a circuit assembly together with TAB films connected to the data electrodes.

The TAB film (second circuit substrate) 27 forming a circuit assembly together with the glass substrate 3 has a structure including TAB-side marks (second alignment marks) 29 as will be described with reference to FIG. 11.

The TAB film 27 has a structure almost similar to that of a conventional one and includes a base film (substrate) 27a, input terminals 27b (not shown in FIG. 11), output terminals 27c and liquid crystal drive ICs 27d (not shown in FIG. 11) mounted between the input and output terminals. The output terminals 27c each have a stripe-shape and are formed by coating a stripe of copper foil with Au or Sn plating. The number of the output terminals 27c and a spacing therebetween correspond to those of the electrodes 20 on the glass substrate 3. The outermost output terminals 27c are each provided with a TAB-side mark 29 formed in contact therewith. The TAB-side marks 29 are of the same material as the output terminals 27c. More specifically, the marks 29 are left un-removed during etching for patterning of the output terminals 27c. In this embodiment, the panel-side marks 23 and the TAB-side marks 29 are formed in such positions that they are not superposed with each other in an appropriately aligned and joined state of the liquid crystal panel P1 and the liquid crystal-drive TAB-film 27. More specifically, the two TAB-side marks 29 are disposed with a spacing therebetween equal to that between the two panel-side marks 23 but the marks 29 and the marks 23 are deviated from each other in a longitudinal direction of the electrodes 20 in the normally joined position as shown in FIG. 13.

Figure 12:
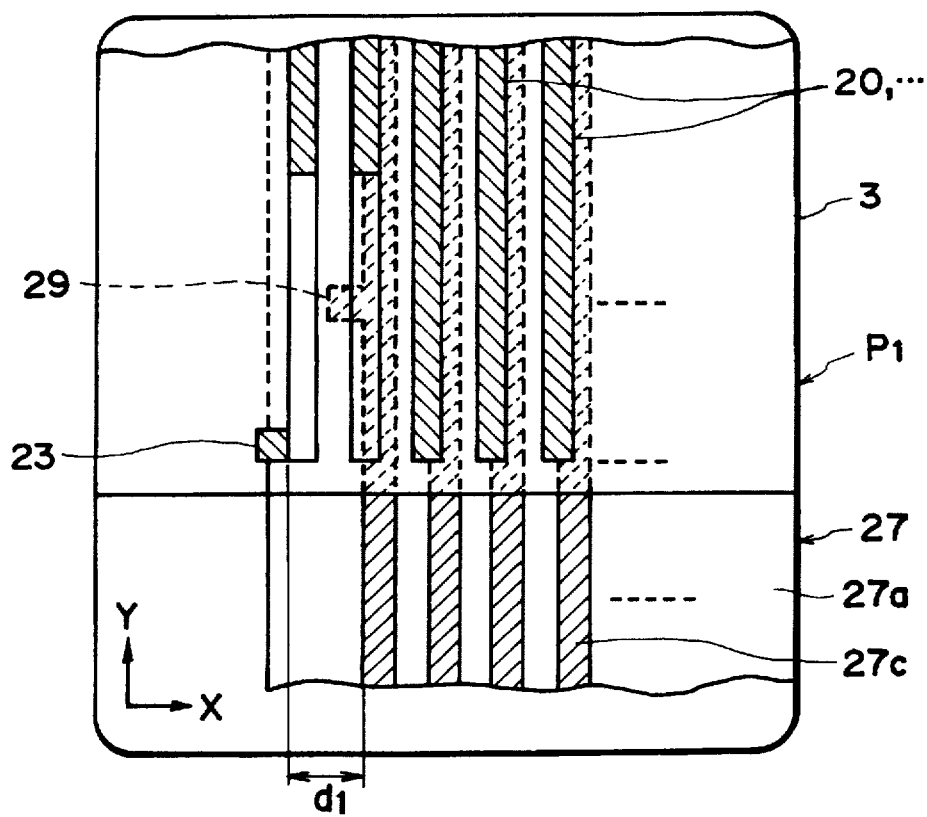
FIG. 12 is a partial schematic plan view of a circuit assembly before positional alignment.
Figure 13:
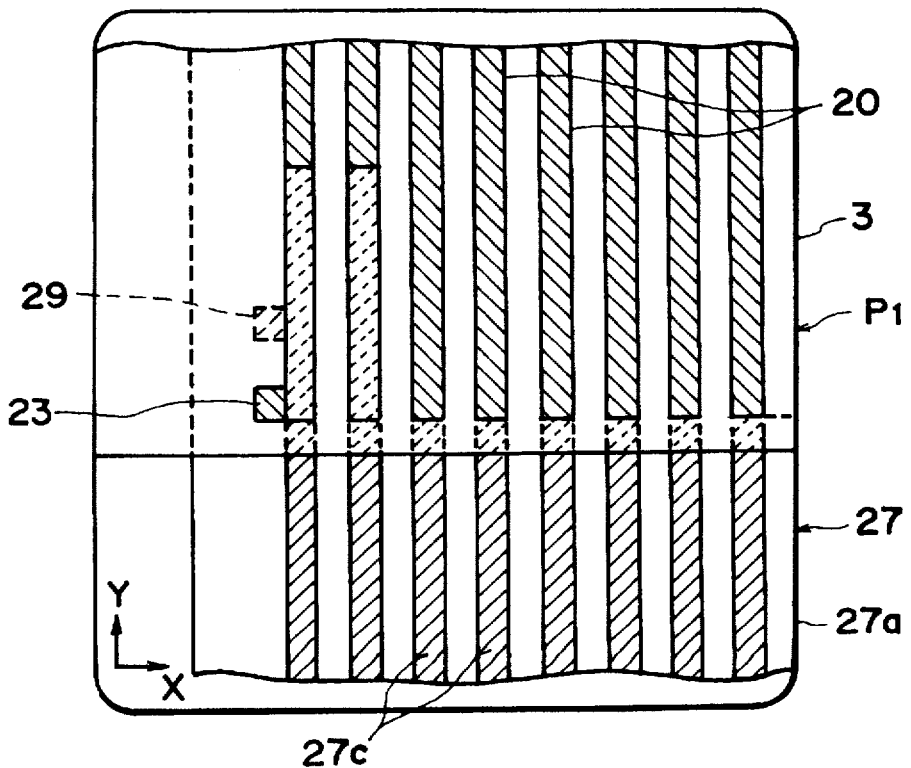
FIG. 13 is a partial schematic plan view of a circuit assembly after positional alignment.

Next, a step of positional alignment between the liquid crystal panel P1 and the TAB-film 27 will be described with reference to FIGS. 12 and 13, including FIG. 12 showing an intermediate state during the positional alignment and FIG. 13 showing a state after the positional alignment (a normally aligned state).

More specifically, FIGS. 12 and 13 show a state wherein the glass substrate 3 of the panel P1 is superposed while directing its front surface downwards with an upwardly directed front surface of the TAB film 27 shown in FIG. 11 as a view observed through a camera finder from the backside of the glass substrate 3 of the panel P1 so as to show a region including the region BR of the glass substrate 3 and the region CL of the TAB film 27.

Now, in case of connecting the TAB film 27 with the liquid crystal panel P1 (more specifically, the glass substrate 3 or 2 thereof), the liquid crystal panel P1 is mounted on the liquid crystal panel alignment unit and the TAB film 27 is mounted on the TAB alignment unit. The mounting operation may be performed automatically by using an apparatus therefor or may be performed manually by an operator. In this instance, it is necessary to roughly adjust the positions in X-directions of both alignment units so that the TAB-side alignment marks 29 are positioned outside the region A, more specifically further outside of the BR region or BL region, to be free from superposition with the metal electrodes 22.

Simultaneously, a rough positional adjustment is performed in Y-directions so as to superpose the region of the electrodes 20 and the regions of the electrodes 27c for connection. In the rough alignment stage, the TAB-side output terminal 27c and the glass substrate-side electrode 20 is still deviated (by $d_1$) as shown in FIG. 12.

Then, when an automatic fine adjustment is started by using a camera, etc., the TAB-side mark 29 disposed in a roughly appropriate position by the above-mentioned rough alignment is recognized by the camera through the transparent glass substrate 3, the anisotropic conductive adhesive 9 and the base film 27a, and the panel-side mark 23 is recognized through the glass substrate 3. The image recognition data by the camera are sent to a data process circuit (not shown), where a deviation (amount) between the marks 23 and 29 is calculated. The deviation is sent to an alignment drive unit, by which the fine positional adjustment of both alignment units is performed. The fine positional alignment may be performed by moving either one or both of the liquid crystal panel alignment unit and the TAB alignment unit. After the fine adjustment, the marks 23 and 29 are placed at their normal positions which are distant from each other with a prescribed spacing in the longitudinal direction of the electrode 20 and free from deviation in the width direction of the electrode 20 as shown in FIG. 13. Thus, after the fine adjustment, the deviation $d_1$ between the TAB-side output terminal 27c and the glass substrate-side electrode 20 is removed. Incidentally, before setting the glass substrate 2 and the TAB film 27 on a positional alignment apparatus, the anisotropic conductive adhesive (film) may be applied or transferred onto at least one of the substrate 2 or 3, so that the glass substrate 2 or 3 and the TAB film 27 at their normal positions are thermally bonded to each other by a thermal press head (not shown) immediately after the positional alignment.

In the above, only the positional alignment of alignment marks 23 and 29 on one side (in the regions BR and CL) has been described with reference to FIGS. 12 and 13, but similar image recognition and positional alignment may be performed by using alignment marks 23 and 29 on the other side (in the regions BL and CR). By performing the image recognition and positional alignment by using alignment marks on both sides, a more accurate positional alignment may be realized.

According to this embodiment, the panel-side mark 23 is made of a metal and also the electrodes 20 in the region B are made transparent (i.e., not of metal electrodes), the panel-side mark 23 can be recognized at a larger contrast. Accordingly, even when the vertical falling illumination is performed in image recognition with a camera, the image recognition accuracy is not affected by the transparent electrode thickness as in the conventional case, so that the accuracy of positional alignment between the liquid crystal panel P1 and the TAB film 27 is improved.

As a matter in general, in case where a TAB-side mark 29 is recognized through a liquid crystal panel P1 as in this embodiment, the image recognition becomes impossible when the TAB-side mark 29 is superposed with an opaque member, such as metal electrodes. In this embodiment, however, the glass substrates 2 and 3 are provided with a transparent region BR and BL, so that the TAB side marks 29 can be recognized as far as they are within the regions BR and BL, so that the above problem can be obviated.

On the other hand, the panel-side mark 23 can be simply formed in the step of forming metal electrodes 22 so that an additional step for the formation thereof is not required, thereby obviating the increase in production cost of the liquid crystal panel P1 and complication of the production steps.

In this embodiment, the panel-side mark 23 and the TAB-side mark 29 are formed so as to have a prescribed spacing therebetween even in their normal connection position. As a result, in case where only either one of the liquid crystal panel P1 and the TAB film 27 is set on their alignment units or where both are placed on the alignment units but either one of the alignment marks 23 and 29 is recognized due to the presence of the other mark outside the recognition range of the camera. In such a case, if the marks 23 and 29 are not designed to have a spacing in their normal position, the above state can be erroneously recognized to indicate the completion of positional alignment. Such a problem can be obviated in this embodiment.

Further, in this embodiment, the connection between the liquid crystal panel P1 and the TAB film 27 may be performed automatically to reduce the production cost.

Second embodiment

A second embodiment of the present invention will now be described with reference to FIGS. 14 to 17.

The liquid crystal display apparatus according to this embodiment, similarly as the first embodiment, has a structure as shown in FIG. 9, including a liquid crystal panel and a number of TAB films.

Figure 14:
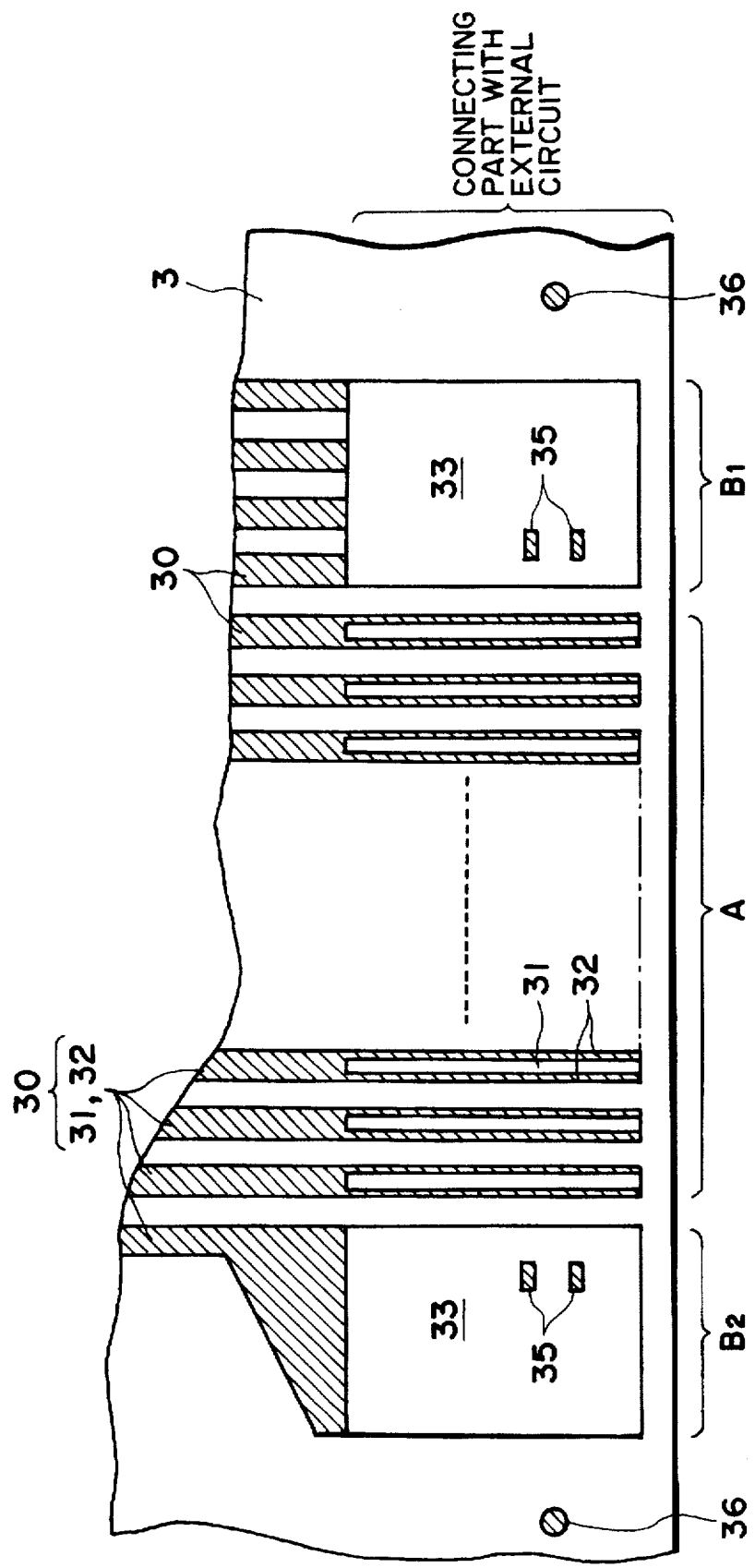
FIG. 14 is a schematic plan view from the reverse side of a first substrate used in the second embodiment of the circuit assembly.

One surface (front surface) of a glass substrate 3 of such a liquid crystal panel P2 is provided with a large number of electrodes 30 as shown in FIG. 14. However, unlike FIG. 10 relating to the first embodiment, FIG. 14 shows a view from the reverse side opposite to the front surface on which the electrodes 30 are formed. The electrodes 30 are formed in stripes in a central region A and have a laminated structure of a transparent electrode 31 and a metal electrode 32. The electrodes 30 extend up to the edge or periphery (exposed portion) of the glass substrate 3. In the peripheral region in the region A, each electrode 30 has a laminated structure of the transparent electrode 31 and the metal electrode 32 only along its side regions and a single layer of transparent electrode 31 at its central elongated region. Except for the peripheral region (exposed region), the metal electrode 32 and the transparent electrode 31 have the same width, and the whole width of the transparent electrode 31 is covered with the metal electrode 32. On the other hand, in both side regions B1 and B2 and in the peripheral regions of the glass substrate 3, a large width portion 33 of transparent electrode is formed in a rectangular shape. Each large width portion 33 is provided with two panel-side eye observation marks 35 for alignment by eye observation. The panel-side eye observation marks 35 are formed in parallel with each other with a prescribed gap therebetween and formed of the same material as the metal electrode 32. Further, in one (right) side region B1, except for its peripheral region, a plurality (4 in FIG. 14) of electrodes 30 each in a laminated structure, a transparent electrode 31 and a metal electrode 32 are formed similarly as in the region A. The transparent electrodes 31 of the electrodes 30 are electrically connected with the large width portion 33. On the other hand, in the other (left) side region B2 except for the peripheral region of the glass substrate 3, only one electrode 30 having a laminated structure of a transparent electrode 31 and a metal electrode 32 is formed so as to be electrically connected with the large width portion 33. Further outside the regions B1 and B2, alignment marks (first alignment marks) 36 are respectively formed in circular spots with the same material as the metal electrode. The alignment marks 36 are used as objects for image recognition by the camera (and hereinafter called "panel-side auto-alignment marks" 36). FIG. 14 shows a structure for only one panel substrate 3 but the other substrate 2 may also be provided with similar shapes of electrodes and panel-side marks. In this embodiment, the liquid crystal panel is designed to be driven by the electrodes 30 in the region A, and the electrodes 30 in the regions B1 and B2 do not participate in the drive, thus being so-called dummy electrodes.

Figure 15:
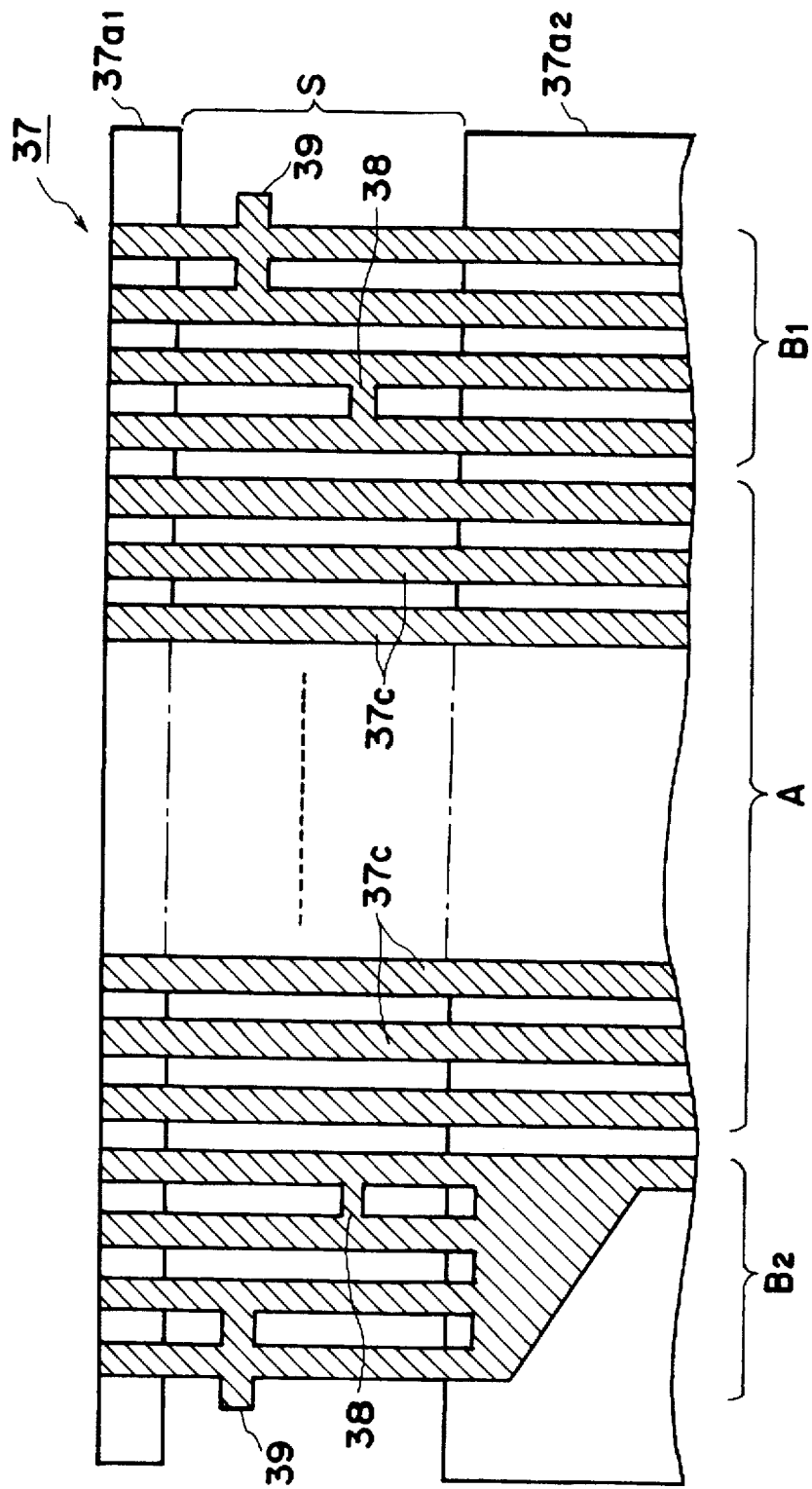
FIG. 15 is a schematic plan view of a second substrate used in the second embodiment of the circuit assembly.

Next, the structure of the TAB film (second circuit substrate) 37 is described with reference to FIG. 15, particularly with respect to shapes and positions of output terminals (electrodes) 37c and alignment marks 38 and 39.

The TAB film 37 has two base film portions 37a1 and 37a2 separated from each other with a spacing S in a longitudinal direction. In their central region A in the lateral direction, the base film portions 37a1 and 37a2 are provided with output terminals (electrodes) 37c which are formed in strips in a number and with a spacing respectively equal to those of the electrodes 30 formed in the region A on the glass substrate 3. The output terminals 37c are bonded to the base film portions 37a1 and 37a2. In the regions B1 and B2 adjacent to the region A, a plurality (4 in FIG. 15) of output terminals 37c are respectively formed. In the region B1, the terminals 37c are formed in the same manner and with the same spacing as the electrodes 30 in the corresponding region B1 of the glass substrate 3. Further, in each of the regions B1 and B2, between the third and fourth output terminals 37c counted from the right or left, respectively, an alignment mark for adjustment by eye observation (hereinafter called "TAB-side eye observation mark") 38 is formed. Further, at the first and second output terminals 37c, TAB-side auto-alignment marks 39 are respectively formed. In this embodiment, the region where these marks 38 and 39 are formed is not provided with a base film, but such a base film may be formed in such a region. The marks 38 and 39 are formed of the same material as the terminals 37c, e.g., copper foil plated with Au or Sn. More specifically, the marks 38 and 39 are left unremoved during etching for patterning of the output terminals 37c. The other structures are similar to those in the first embodiment. The output terminals are connected with a liquid crystal driver IC (not shown) mounted by TAB which is further connected with input terminals (not shown). In this embodiment, the panel-side eye observation marks 35 are disposed at such a position that the TAB-side eye-observation mark 38 is put between the marks 35 without causing superposition of the marks 35 and 38 in a normally aligned state between the liquid crystal panel P2 and the TAB-film 37. Further, the TAB-side auto-alignment marks 39 and the panel-side auto-alignment marks 36 are disposed in such positions not causing superposition therebetween in a normally aligned position.

Figure 16:
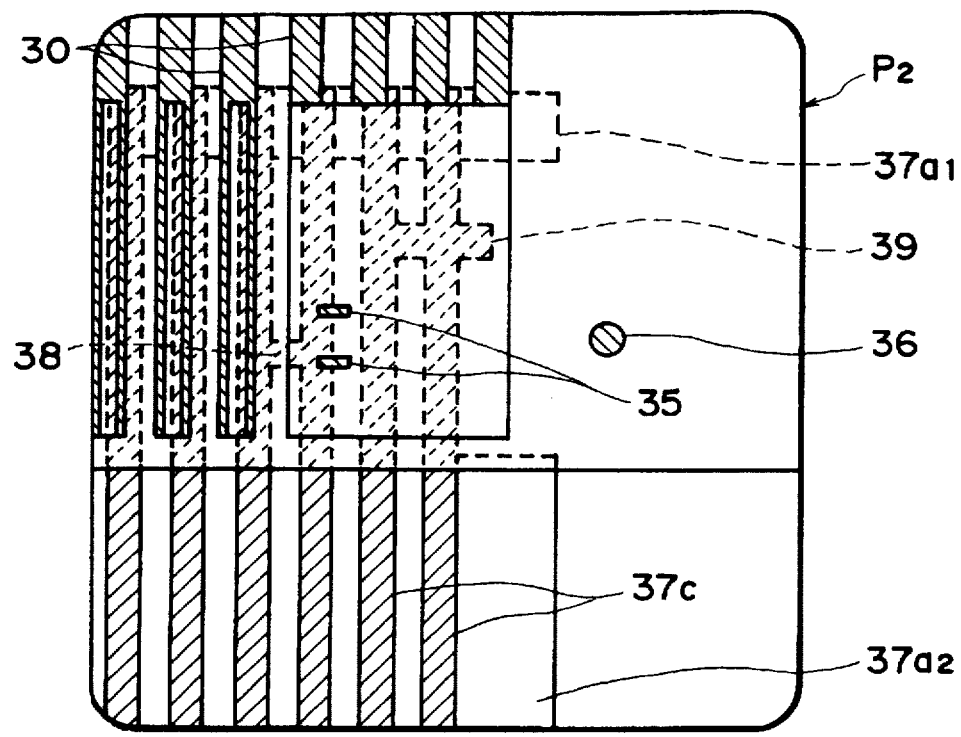
FIG. 16 is a partial schematic plan view of a circuit assembly before positional alignment.
Figure 17:
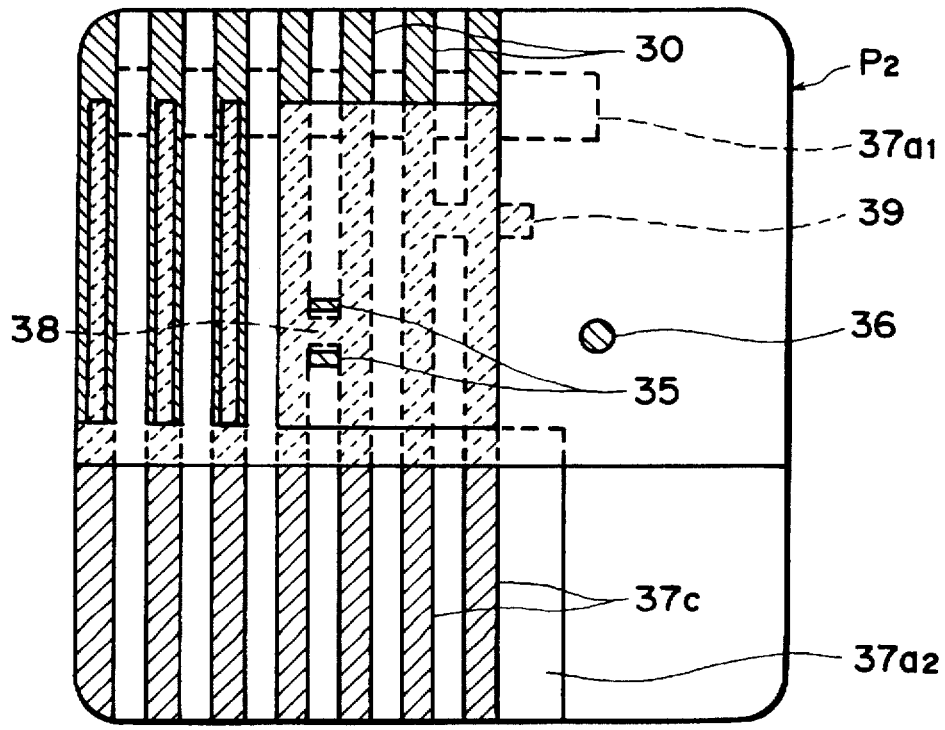
FIG. 17 is a partial schematic plan view of a circuit assembly after positional alignment.

Next, a step of positional alignment between the liquid crystal panel P2 and the TAB film 37 is described with reference to FIGS. 16 and 17, of which FIG. 16 shows an intermediate state during positional alignment and FIG. 17 shows a state after the positional alignment (a normally aligned state).

Now, the liquid crystal panel P2 and the TAB film 37 are mounted on the panel alignment unit and the TAB-alignment unit, respectively. Then, the glass substrate (of the panel) and the TAB films are subjected to rough positional alignment while observing their entire shapes with eyes or by moving a glass substrate to a prescribed position by observing a panel-side mark and abutting and sliding the TAB film for rough alignment (FIG. 16). The rough alignment in this instance should be performed so that the TAB-side eye observation mark 38 and TAB-side auto-alignment mark 39 are in a region outside the region A (i.e., in the region B or in a region outside the region B) so as not to be superposed with the metal electrodes 32.

Then, when an automatic fine adjustment is started, the TAB-side auto-alignment mark 39 is recognized by the camera through the transparent glass substrate 3 and the anisotropic conductive adhesive 9, and the panel-side auto-alignment mark 36 is recognized through the transparent glass substrate 3. The image recognition data from the camera is sent to a prescribed data process unit, where a deviation between the marks 36 and 39 is calculated. The deviation is sent as a signal to an alignment drive unit (not shown), by which the fine positional adjustment of both alignment units is performed by moving either one or both of the liquid crystal panel alignment unit and the TAB alignment unit. Whether the fine positional alignment is accurately performed or not is checked by observing the relative positions of the eye-observation marks 35 and 38. After completion of the positional alignment, the liquid crystal panel P2 and the TAB films 37 are thermally bonded to each other. In the above, only the positional alignment of alignment marks 36 and 39 on one side has been described with reference to FIGS. 16 and 17, but similar image recognition and positional alignment may be performed by using alignment marks 36 and 39 on the other side. By performing the image recognition and positional alignment by using alignment marks on both sides, an accurate positional alignment may be performed.

The following advantageous effects are attained by this embodiment.

According to this embodiment, the panel side marks 35 and 36 are made of a metal and the regions B close to these marks are free from metal electrodes, so that the panel-side marks 35 and 36 can be recognized at an increased contrast with the region B. Accordingly, even when the vertical falling illumination is performed in image recognition with a camera, the image recognition accuracy is not affected by the transparent electrode thickness as in the conventional case, so that the accuracy of positional alignment between the liquid crystal panel P2 and the TAB film 37 is improved.

As a matter in general, in case where a TAB-side mark 39 is recognized through a liquid crystal panel P2 as in this embodiment, the image recognition becomes impossible when the TAB-side mark 39 is superposed with an opaque member, such as metal electrodes. In this embodiment, however, the glass substrates 2 and 3 are provided with transparent regions, so that the TAB-side marks 39 can be recognized as far as they are within the regions B, so that the above problem can be obviated.

On the other hand, the panel-side marks 35 and 36 can be simply formed in the step of forming metal electrodes 32 so that an additional step for the formation thereof is not required, thereby obviating the increase in production cost of the liquid crystal panel P2 and complication of the production steps.

In this embodiment, the panel-side mark 36 and the TAB-side mark 39 are formed so as to have a prescribed spacing therebetween even in their normal connection position. As a result, in case where only either one of the liquid crystal panel P2 and the TAB film 37 is set on their alignment units or where both are placed on the alignment units but either one of the alignment marks 36 and 39 is recognized due to the presence of the other mark outside the recognition range of the camera. In such a case, if the marks 36 and 39 are not designed to have a spacing in their normal position, the above state can be erroneously recognized to indicate the completion of positional alignment. Such a problem can be obviated in this embodiment.

Further, in this embodiment, the eye observation marks 35 and 38 are provided so that the positional alignment and positional confirmation can be performed by eye observation. Accordingly, by performing the automatic positional alignment and the position confirmation by eye observation in combination, the positional alignment accuracy can be further improved. Further, even in case where the auto-alignment marks 36 and 39 cannot be satisfactorily recognized because of, e.g., an incomplete shape, the positional alignment can be performed by eye observation.

In this embodiment, the connection between the liquid crystal panel P2 and the TAB-films 37 may be performed automatically, thereby reducing the production cost.

Incidentally, in the above-described embodiments, the metal electrodes (particularly those outside the peripheral regions) have been described to have the same width as the transparent electrodes but this is not necessary. Instead, the metal electrodes may be formed in a smaller width so as to cover only a portion along an edge of the transparent electrodes. Further, the number of transparent electrodes free from coverage with metal electrodes can be different from those described in the above embodiments. In the above embodiments, the electrodes formed in the region B (BR and BL or B1 and B2) have been described as dummy electrodes but can be used for driving the (liquid crystal) panel. In such a case, however, it is desirable to lower the resistivity of the electrodes, e.g., by using plural electrodes as a set. The above embodiments have been described as an application to a liquid crystal display apparatus but, of course, this is not necessary. The present invention is generally applicable to a circuit assembly including a connection of a transparent substrate (first circuit substrate) and an external circuit substrate (second circuit substrate).

As described hereinabove, according to the present invention, an increased contrast is given between an first alignment mark and a region in proximity with the alignment mark on a first circuit substrate. Accordingly, a positional alignment between a first circuit substrate and a second circuit substrate can be performed automatically with easy image recognition and at a high accuracy even when the alignment mark is recognized under the vertical falling illumination.

Further, in case where a region in the neighborhood of first alignment mark on a first circuit substrate is made transparent, the contrast between the transparent region and the first alignment mark is further increased to further ensure the above effect, and a second alignment mark on a second circuit substrate can be recognized through the first circuit substrate, thereby further increasing positional alignment accuracy.

Further, as the first alignment mark is non-light-transmissive, the positional alignment and position confirmation by eye observation become easy. As a result, an auto-positional alignment and a position confirmation by eye observation can be performed in combination, to further increase the positional alignment accuracy between the circuit substrates.

Further, in case where the first and second alignment marks are formed in such positions that they are not superposed with each other in a state where the first and second circuit substrates are normally aligned and connected with each other, it becomes possible to easily confirm the normally aligned state of both circuit substrates for proper connection.

Further, by forming the electrodes on the first circuit substrate in a laminated structure of a transparent electrode layer and a metal electrode layer, the electrode resistivity can be lowered to provide an increased drive speed on the first circuit substrate. In this instance, if the electrodes in the vicinity of the first alignment marks are constituted by only transparent electrodes, an increased contrast is given between the alignment marks and the vicinity region, the above-mentioned effects are ensured. The above-mentioned first alignment marks can be made of the same material as the metal electrodes, whereby the alignment marks can be formed simultaneously with the production of the metal electrodes, thus requiring no additional step therefor and preventing the increase in production cost and complication of the production steps.

On the other hand, by forming the transparent electrode formed in the vicinity of the first alignment mark in ia larger width, the transparent electrode can have a low resistivity and be suitably used as a drive electrode similarly as a transparent electrode laminated with a metal electrode.

Further, by using the first circuit substrate for producing a liquid crystal display apparatus, it is possible to provide a liquid crystal display apparatus having the above-mentioned advantageous effects.

Further, by effecting the connection of the first and second circuit substrates automatically by using a camera, etc., the production cost can be reduced.

What is claimed is:

1. A circuit assembly, comprising:

a transparent first substrate having thereon a plurality of first electrodes and a first alignment mark, and a second substrate having thereon a plurality of second electrodes and a second alignment mark, said second substrate being at least partially superposed with the first substrate so that the mutually corresponding first and second electrodes are superposed and electrically connected with each other, wherein the first electrode has a light-transmissive layer and an opaque layer laminated with the light transmissive layer, and a portion of the first electrode superposed with the second substrate at least partially includes a light-transmissive portion, the second alignment mark is disposed at a position of the second substrate corresponding to the light-transmissive portion of the first electrode, and said first alignment mark and second alignment mark are disposed at such positions that they are not superposed with each other in a state where the first and second substrates are normally connected with each other.

2. A circuit assembly according to claim 1, wherein said light-transmissive layer comprises a transparent conductor, and said opaque layer comprises a metal.

3. A circuit assembly according to claim 1, wherein at least one of said alignment marks comprises an opaque layer.

4. A circuit assembly according to claim 1, wherein said light-transmissive layer comprises a metal oxide, and said opaque layer comprises a metal.

5. A circuit assembly according to claim 1, wherein the second substrate has a first alignment mark thereon, and the first substrate has a second alignment mark in the vicinity of the light-transmissive portion.

6. A circuit assembly according to claim 5, wherein electrodes in the vicinity of the second alignment mark are composed solely of transparent electrodes.

7. A circuit assembly according to claim 1, wherein said first substrate comprises a material selected from the group consisting of glass, quartz, alumina, and resin.

8. A circuit assembly according to claim 1, wherein said second substrate is flexible.

9. A circuit assembly according to claim 8, wherein said second alignment mark is disposed adjacent to the first electrode in a state where the first and second electrodes are connected to each other.

10. A circuit assembly according to claim 8, wherein said first alignment mark is disposed adjacent to the second electrode in a state where the first and second electrodes are connected to each other.

11. A circuit assembly according to claim 1, wherein said first substrate and said second substrate are bonded to each other with an electroconductive adhesive.

12. A circuit assembly according to claim 1, wherein said first substrate and said second substrate are bonded to each other with an anisotropic electroconductive adhesive.

13. A circuit assembly according to claim 1, wherein a first plurality (n) of the first electrodes are arranged in a direction to form an electrode array and such an electrode array is arranged in a second plurality (m) in the direction on the first substrate.

14. A circuit assembly according to claim 1, wherein a first plurality (n) of the first electrodes are arranged in a direction to form an electrode array and a second plurality (m) of the electrode array is arranged in the direction on the first substrate.

15. A circuit assembly according to claim 1, wherein said first electrodes include first electrodes lacking said light-transmissive portion and connected to a functional element formed on the first substrate and a first electrode having said light-transmissive portion and not connected to said functional element.

16. A circuit assembly according to claim 1, wherein each first electrode has a width of 5–800 μm.

17. A circuit assembly according to claim 16, wherein an adjacent pair of first electrodes are disposed with a spacing of 5–800 μm.

18. A display apparatus including a circuit assembly according to claim 1.

19. An image sensor including a circuit assembly according to claim 1.

20. A light-emitting device including a circuit apparatus according to claim 1.

21. A liquid crystal device including a circuit assembly according to claim 1.

22. A circuit assembly according to claim 1, wherein a pair of said transparent first substrates are disposed opposite to each other and a liquid crystal is disposed between the pair of first substrates to provide a liquid crystal display device, and said second substrate has a drive semiconductor device for outputting signals of prescribed waveforms applied to the liquid crystal display device so as to effect a display.

23. A circuit assembly according to claim 22, wherein said first electrodes includes a plurality of first electrodes having only a transparent portion in the vicinity of the alignment mark, which first electrodes are not supplied with signals for driving the liquid crystal display device.

24. A circuit assembly according to claim 22, wherein said liquid crystal disposed between said pair of first substrates is a ferroelectric liquid crystal.

25. A circuit assembly according to claim 22, wherein said second substrate and said first substrates are bonded to each other with an anisotropic electroconductive adhesive.

26. A circuit assembly according to claim 1, wherein said second alignment mark is formed adjacent to and integrally with the second substrate.

27. A circuit assembly according to claim 1, wherein said first alignment mark is formed adjacent to and integrally with the first electrode.

28. A circuit assembly, comprising:

a second substrate having thereon a plurality of first electrodes, and a second substrate having thereon a plurality of second electrodes and at least partially superposed with the first substrate so that the mutually corresponding first and second electrodes are superposed and electrically connected with each other, wherein the first electrode has a light-transmissive layer and an opaque layer laminated with the light transmissive layer, and a portion of the first electrode superposed with the second substrate at least partially includes a light-transmissive portion, the second substrate has an alignment mark at a position thereof corresponding to the light-transmissive portion of the first electrode, and the first substrate has a second alignment mark in the vicinity of the light-transmissive portion, and said first alignment mark and second alignment mark are disposed at such positions that they are not superposed with each other in a state where the first and second substrates are normally connected with each other.

29. A circuit assembly, comprising:

a transparent first substrate having thereon a plurality of first electrodes, and a second substrate having thereon a plurality of second electrodes and at least partially superposed with the first substrate so that the mutually corresponding first and second electrodes are superposed and electrically connected with each other, wherein the first electrode has a light-transmissive layer and an opaque layer laminated with the light transmissive layer, and a portion of the first electrode superposed with the second substrate at least partially includes a light-transmissive portion, the second substrate has an alignment mark at a position thereof corresponding to the light-transmissive portion of the first electrode, and the first substrate has a second alignment mark in the vicinity of the light-transmissive portion, wherein
 a transparent electrode in the vicinity of the second alignment mark is formed in a larger width than the other transparent electrodes.

30. A circuit assembly, comprising:
 a transparent first substrate having thereon a plurality of first electrodes, and
 a second substrate having thereon a plurality of second electrodes and at least partially superposed with the first substrate so that the mutually corresponding first and second electrodes are superposed and electrically connected with each other,
 wherein the first electrode has a light-transmissive layer and an opaque layer laminated with the light transmissive layer, and a portion of the first electrode superposed with the second substrate at least partially includes a light-transmissive portion, and
 the first or second substrate has an alignment mark at a position thereof corresponding to the light-transmissive portion of the first electrode, wherein
 a portion of the second electrode connected to the first electrode is separated from the second substrate so that an external stress applied to the second substrate is prevented from being directly applied to the second electrode.

31. A circuit assembly, comprising:
 a transparent first substrate having thereon a plurality of first electrodes, and
 a second substrate having thereon a plurality of second electrodes and at least partially superposed with the first substrate so that the mutually corresponding first and second electrodes are superposed and electrically connected with each other,
 wherein the first electrode has a light-transmissive layer and an opaque layer laminated with the light transmissive layer, and a portion of the first electrode superposed with the second substrate at least partially includes a light-transmissive portion,
 the first or second substrate has an alignment mark at a position thereof corresponding to the light-transmissive portion of the first electrode, wherein
 said light-transmissive portion of the first electrode has a width corresponding to at least twice that of the first electrode at the connecting part.

32. A circuit assembly, comprising:
 a transparent first substrate having thereon a plurality of first electrodes, and
 a second substrate having thereon a plurality of second electrodes and at least partially superposed with the first substrate so that the mutually corresponding first and second electrodes are superposed and electrically connected with each other,
 wherein the first electrode has a light-transmissive layer and an opaque layer laminated with the light transmissive layer, and a portion of the first electrode superposed with the second substrate at least partially includes a light-transmissive portion, and
 the first or second substrate has an alignment mark at a position thereof corresponding to the light-transmissive portion of the first electrode, wherein
 said first electrodes include a first electrode having said transparent portion and functioning as a dummy electrode, to which a second electrode also functioning as a dummy electrode is connected.

33. A circuit assembly, comprising:
 a transparent first substrate having thereon a plurality of first electrodes, and
 a second substrate having thereon a plurality of second electrodes and at least partially superposed with the first substrate so that the mutually corresponding first and second electrodes are superposed and electrically connected with each other,
 wherein the first electrode has a light-transmissive layer and an opaque layer laminated with the light transmissive layer, and a portion of the first electrode superposed with the second substrate at least partially includes a light-transmissive portion,
 the first or second substrate has an alignment mark at a position thereof corresponding to the light-transmissive portion of the first electrode, wherein
 said first electrodes include a first electrode having said transparent portion and functioning as a dummy electrode, to which a second electrode also functioning as a dummy electrode is connected, and said first electrode and said second electrode both functioning as dummy electrodes are connected to each other with an anisotropic conductive adhesive.

34. A circuit assembly comprising:
 a transparent first substrate having thereon a plurality of first electrodes, and
 a second substrate having thereon a plurality of second electrodes and at least partially superposed with the first substrate so that the mutually corresponding first and second electrodes are superposed and electrically connected with each other,
 wherein the first electrode has a light-transmissive layer and an opaque layer laminated with the light transmissive layer, and a portion of the first electrode superposed with the second substrate at least partially includes a light-transmissive portion, and
 the first or second substrate has an alignment mark at a position thereof corresponding to the light-transmissive portion of the first electrode,
 wherein said first electrodes are arranged such that the length includes a first length allotted for the portion of said first electrode having said light-transmissive portion and a second length which is at least 10 times the first length and is allotted for another portion of said first electrodes lacking said light-transmissive portion.

35. A circuit assembly, comprising:
 a transparent first substrate having thereon a plurality of first electrodes, and
 a second substrate having thereon a plurality of second electrodes and at least partially superposed with the first substrate so that the mutually corresponding first and second electrodes are superposed and electrically connected with each other,
 wherein the first electrode has a light-transmissive layer and an opaque layer laminated with the light transmissive layer, and a portion of the first electrode superposed with the second substrate at least partially includes a light-transmissive portion,
 the first or second substrate has an alignment mark at a position thereof corresponding to the light-transmissive portion of the first electrode, and
 a first plurality (n) of the first electrodes are arranged in a direction to form an electrode array and such an electrode array is arranged in a second plurality (m) in the direction on the first substrate,
wherein an adjacent pair of electrodes are disposed with a spacing therebetween so as to dispose an alignment mark on the first substrate within a region of a half of the spacing.

36. A process for producing a circuit assembly, comprising the steps of:
providing a light-transmissive first substrate having thereon a first alignment mark and group of first electrodes including a first electrode having a light-transmissive portion and first electrodes having an opaque portion,
providing a second substrate having thereon a group of second electrodes and a second alignment mark,
superposing the first and second substrates with an adhesive disposed therebetween,
positionally aligning the first and second substrates by means of said alignment marks, said first alignment mark and second alignment mark being disposed at such positions that they are not superposed with each other in a state where the first and second substrates are normally connected with each other; and
bonding the first and second substrates to each other.

37. A process according to claim 36, wherein said second alignment mark is disposed adjacent to the first electrode in a state where the first and second electrodes are connected to each other.

38. A process according to claim 36, wherein said first alignment mark is disposed adjacent to the second electrode in a state where the first and second electrodes are connected to each other.

39. A process according to claim 36, wherein said second alignment mark is formed adjacent to and integrally with the second electrode.

40. A process according to claim 36, wherein said first alignment mark is formed adjacent to and integrally with the first electrode.

41. A positional alignment method including steps of:
providing a first alignment unit for carrying a transparent first circuit substrate having a first electrode and a first alignment mark thereon,
providing a second alignment unit for carrying a second circuit substrate having a second electrode and a second alignment mark thereon,
providing a camera for image-recognizing the first alignment mark and the second alignment mark,
calculating a deviation between the first and second alignment mark, said first alignment mark and second alignment mark being disposed at such positions that they are not superposed with each other in a state where the first and second substrates are normally connected with each other, and
moving at least one of said first and second alignment units relative to each other based on the calculated deviation to effect a positional alignment between the first and second circuit substrates,
wherein said camera is disposed to recognize the second alignment mark through a transparent portion of said first electrode on the first circuit substrate.

42. A method according to claim 41 wherein said second alignment mark is disposed adjacent to the first electrode in a state where the first and second electrodes are connected to each other.

43. A method according to claim 33, wherein said first alignment mark is disposed adjacent to the second electrode in a state where the first and second electrodes are connected to each other.

44. A method according to claim 41, wherein said second alignment mark is formed adjacent to and integrally with the second electrode.

45. A method according to claim 41, wherein said first alignment mark is formed adjacent to and integrally with the first electrode.

* * * * *

UNITED STATES PATENT AND TRADEMARK OFFICE
CERTIFICATE OF CORRECTION

PATENT NO. : 5,729,315

DATED : March 17, 1998

INVENTOR(S) : MASANORI TAKAHASI ET AL.

It is certified that error appears in the above-identified patent and that said Letters Patent is hereby corrected as shown below:

On title page,

AT [56] REFERENCES CITED

U.S. PATENT DOCUMENTS

Insert:
```
--5,019,201   5/1991  Yabu et al..........156/273.9
  5,150,231   9/1992  Iwamoto et al.......359/44
  5,182,662   1/1993  Mihara..............359/63
  5,212,575   5/1993  Kojima et al........359/82
  5,270,848  12/1993  Takabayashi et al...359/88
  5,353,196  10/1994  Takahashi...........361/760
  5,360,943  11/1994  Mori et al..........174/84 R--.
```

AT [57 ABSTRACT

Line 9, "light transmissive" should read --light-transmissive--.

IN THE DRAWINGS

Sheet 5, FIG. 8, "ALINMENT" (both occurrences) should read --ALIGNMENT--.

COLUMN 1

Line 10, "frequency" should read --frequently--;
Line 14, "a" (first occurrence) should read --an--;
Line 22, "described." should read --be described.--; and
Line 62, "7bof" should read --7b of--.

COLUMN 3

Line 17, "12)is" should read --12) is--.

UNITED STATES PATENT AND TRADEMARK OFFICE
CERTIFICATE OF CORRECTION

PATENT NO. : 5,729,315
DATED : March 17, 1998
INVENTOR(S) : MASANORI TAKAHASI ET AL.

It is certified that error appears in the above-identified patent and that said Letters Patent is hereby corrected as shown below:

COLUMN 5

Line 9, "(i.e.,.," should read --(i.e.,--; and
    Line 26, "position" should read --portion--.

COLUMN 6

Line 26, "substrate" should read --substrates--.

COLUMN 8

Line 56, "un-removed" should read --unremoved--.

COLUMN 13

Line 63, "an first" should read --a first--.

COLUMN 14

Line 41, "ia" should read --a--; and
    Line 64, "light transmis-" should read
        --light-transmis- --.

COLUMN 15

Line 48-52, Claim 14 should read as follows:
        --14. A circuit assembly according
    to claim 13, wherein each electrode array
    includes a first electrode having said
    light-transmissive portion at both ends
    of the array.--.

UNITED STATES PATENT AND TRADEMARK OFFICE
CERTIFICATE OF CORRECTION

PATENT NO. : 5,729,315

DATED : March 17, 1998

INVENTOR(S) : MASANORI TAKAHASI ET AL.

It is certified that error appears in the above-identified patent and that said Letters Patent is hereby corrected as shown below:

COLUMN 16

Line 15, "includes" should read --include--;
    Line 32, "second" should read --transparent first--;
    Line 41, "light transmis-" should read
           --light-transmis- --; and
    Line 64, "light transmis-" should read
           --light-transmis- --.

COLUMN 17

Line 18, "light transmis-" should read
           --light-transmis- --; and
    Line 39, "light transmis-" should read
           --light-transmis- --.

COLUMN 18

Line 26, "assembly" should read --assembly,--;
    Line 35, "light transmis-" should read
           --light-transmis- --; and
    Line 58, "light transmis-" should read
           --light-transmis- --.

UNITED STATES PATENT AND TRADEMARK OFFICE
CERTIFICATE OF CORRECTION

PATENT NO. : 5,729,315
DATED : March 17, 1998
INVENTOR(S) : MASANORI TAKAHASI ET AL.

It is certified that error appears in the above-identified patent and that said Letters Patent is hereby corrected as shown below:

COLUMN 20

Line 24, "claim 41" should read --claim 41,--; and
Line 28, "claim 33," should read --claim 41,--.

Signed and Sealed this

Third Day of November, 1998

Attest:

Attesting Officer

BRUCE LEHMAN

Commissioner of Patents and Trademarks